US005329682A

United States Patent [19]

Thurn et al.

[11] Patent Number: 5,329,682

[45] Date of Patent: Jul. 19, 1994

[54] METHOD FOR THE PRODUCTION OF ULTRASOUND TRANSFORMERS

[75] Inventors: Rudolf Thurn, Kemnath; Hans-Joachim Burger, Kümersbruck, both of Fed. Rep. of Germany

[73] Assignee: Siemens Aktiengesellschaft, Munich, Fed. Rep. of Germany

[21] Appl. No.: 90,562

[22] Filed: Jul. 12, 1993

Related U.S. Application Data

[63] Continuation of Ser. No. 831,868, Feb. 5, 1992, abandoned.

[30] Foreign Application Priority Data

Feb. 7, 1991 [EP] European Pat. Off. ........ 91101712.7

[51] Int. Cl.[5] .............................................. H01L 41/22

[52] U.S. Cl. .................................... 29/25.35; 310/334

[58] Field of Search ................ 29/25.35; 310/330-337

[56] References Cited

U.S. PATENT DOCUMENTS 3,928,777 12/1975 Massa ............................. 310/334 X
4,128,370 12/1978 Massa ................................ 425/128
4,326,274 4/1982 Hotta et al. ..................... 310/334 X
4,536,673 8/1985 Forster ............................... 310/334
4,823,042 4/1989 Coffey et al. ....................... 310/322
5,121,628 6/1992 Merkl et al. .................... 310/334 X

FOREIGN PATENT DOCUMENTS 3401979 7/1985 Fed. Rep. of Germany .

*Primary Examiner*—Carl E. Hall
*Attorney, Agent, or Firm*—Kenyon & Kenyon

[57] ABSTRACT

A method for producing an ultrasound transformer as a single integral unit that includes a piezoelectric transformer element coupled to an acoustical matching layer formed from an elastomer capable of vibrating. The method includes the steps of: producing an elastomer body from a molded part which has centering contours; positioning the transformer element into the elastomer body; centering the transformer element with the centering contours; and, coupling the transformer element to the matching layer.

16 Claims, 1 Drawing Sheet

METHOD FOR THE PRODUCTION OF ULTRASOUND TRANSFORMERS

This application is a continuation of application Ser. No. 07/831,868, filed on Feb. 5, 1992, now abandoned.

BACKGROUND OF THE INVENTION

The invention relates generally to a method for producing an ultrasound transformer having a piezoelectric transformer element and more particularly, to an ultrasound transformer having a transformer element that is coupled to an acoustical matching layer formed of an elastomer capable of vibrating, as a single, uniform body.

Methods for producing ultrasound transformers of the type mentioned above are known. For example, such a known method is disclosed in U.S. Pat. No. 4,128,370. This reference discloses a solid body ultrasound transformer in which a matching layer consisting of an elastomer is used for matching to the surrounding medium of air. When applying the elastomer to the transformer element, the latter should be held in position as precisely as possible, with respect to its outer contours or to a housing. To accomplish this positioning, the aforementioned U.S. patent provides centering elements that position the transformer element centrally with respect to the elastomer and at the proper height and plane that is parallel to the elastomer. To apply the elastomer matching layer to the transformer element, a complicated device is used, which press heats the elastomer directly onto the transformer element while under pressure, into a specially structured cavity. The pressure that is exerted is limited by a spring system which is part of the device, so that the transformer element, which is formed from a piezoceramic element, does not degrade under excessive pressure with respect to its properties such as polarization and sensitivity. The centering element used in the aforementioned method has openings, i.e. cavities, into which lead wires contacting the transformer element must be threaded before applying the matching layer. It is not possible to test the quality of the matching layer itself, which might be limited due to undesirable air inclusions, for example.

Therefore, the prior art does not provide a simple method for producing ultrasound transformers that avoids the above-mentioned disadvantages.

SUMMARY OF THE INVENTION

The present invention provides a method for producing an ultrasound transformer as a single integral unit that includes a piezoelectric transformer element coupled to an acoustical matching layer formed from an elastomer capable of vibrating. The method includes the steps of: producing an elastomer body from a molded part which has centering contours; positioning the transformer element into the elastomer body; centering the transformer element with the centering contours; and, coupling the transformer element to the matching layer.

As a result of this method, it is possible to test the properties of the matching layer, which include physically important parameters such as density, acoustical velocity, homogeneity, etc., so that in case of a negative test result, only the molded part needs to be eliminated. Thus, the quality of the matching layer by itself can be tested in a simple manner, with several measurements. In contrast to the method of the present invention, known methods test the ultrasound transformer together with the transformer element, which results in greater amounts of waste and unnecessary expenditures. In the method of the present invention, the transformer element is not subjected to any pressure when the matching layer is applied, and hence its sensitivity remains unchanged. Another advantage of the method of the present invention results from the fact that only a small number of simple tools and auxiliary means are required.

In order to achieve good acoustical transfer from the transformer element to the matching layer, it is advantageous if the transformer element is glued to the matching layer. The present invention advantageously provides a simple structure if two of the surfaces of the transformer element are metallized in order to form electrical connections and if a first lead wire is inserted between the first metallized surface and the matching layer when the first metallized surface is glued to the matching layer so that the first lead wire contacts the first metallized surface by adhesive pressure. Further, it is advantageous if a second lead wire is soldered to the second metallized surface. As a consequence, complicated threading of the lead wires is advantageously avoided.

In an alternative embodiment of the invention, the molded part may be formed in such a way that after the transformer element is inserted into the molded part, a space is formed that can be filled with a damping material. The molded part holds the transformer element and, at the same time, may serve as a holder for the damper material, if necessary. This embodiment advantageously provides a transformer structure that is uniform.

It is advantageous if the acoustical matching layer is formed from an elastomer having a propagation velocity for longitudinal waves between 800 and 1600 m/s, a density between 500 and 1500 kg/m$^3$, a low modulus of elasticity and low mechanical vibration damping.

DETAILED DESCRIPTION

Figure 1:
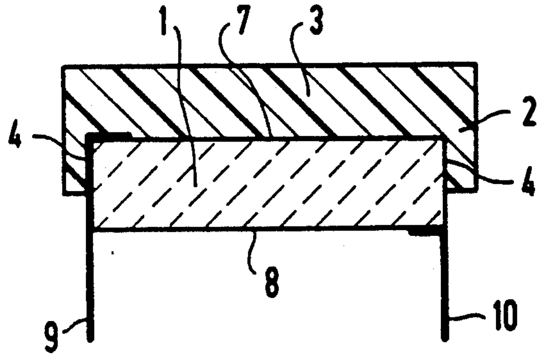
FIG. 1 shows an ultrasound transformer without a damping material constructed according to the principles of the present invention.

FIG. 1 shows an ultrasound transformer which has a molded part 2 as the acoustical matching layer 3 and a transformer element 1 positioned therein. The positioning of the transformer element 1 takes place via centering contours 4 in the molded part 2. The matching layer 3 is a component of the molded part 2, which is formed from a casting. It forms the sound emitting and receiving element of the ultrasound transformer and it has a thickness of $\lambda/4$, where $\lambda$ is the wavelength of the transformer vibrations in the matching layer 3. It also serves for matching the high acoustical wave resistance of the transformer element of approximately $2 \cdot 10^7$ kg/m$^2$s to the very low wave resistance of air, of $4 \cdot 10^2$ kg/m$^2$s. The matching provides a high degree of effectiveness in sound emission and reception. The acoustical wave resistance is determined by the product of the acoustical velocity and the density, so that low values of these two material constants are a prerequisite for good matching to the medium of air. Elastomers having a density between 500 and 1500 kg/m$^3$ and a propagation velocity for longitudinal waves between 800 and 1600 m/s result in good matching to the surrounding medium of air. To achieve large ranges, the material of the matching layer should also have a low mechanical damping constant.

Figure 2:
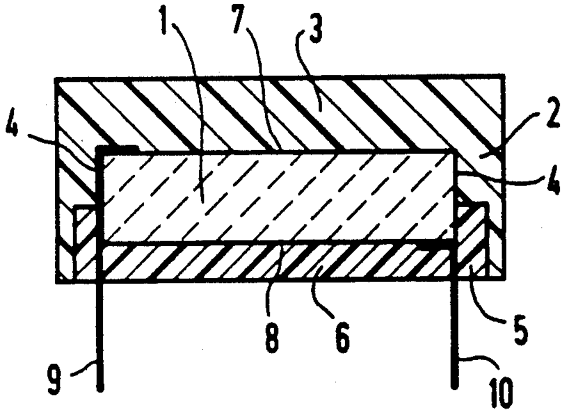
FIG. 2 shows an alternative embodiment of the ultrasound transformer of the present invention which has a damping material.

The transformer element 1 is glued to the matching layer 3 of the molded part 2, with the resulting adhesive pressure providing a means for making a contact between a first lead wire 9 and a metallized surface 7 of the transformer element 1. A second lead wire 10 is soldered directly onto a second metallized surface 8, forming a connection to the transformer element. In the embodiment illustrated in FIG. 1, the molded part 2 only partially projects beyond the sides of the transformer element 1, which in this embodiment is disk-shaped. In contrast, FIG. 2 shows an ultrasound transformer with a molded part 2 which forms a space 5 after insertion of the transformer element 1. The space 5 can be filled with damping material 6, if necessary. The damping material 6 can be applied by means of glue or casting technology and serves for reducing the transformer quality, as it is necessary for measurements in the close range.

The method of the present invention is suitable for utilizing different material combinations with respect to acoustical, physical or chemical requirements in a simple manner. Furthermore, it is unimportant whether several housing parts or shielding elements or similar items are being integrated at the same time. The method of producing a transformer of the present invention from prefabricated elements has the advantage that the transformer components may already have been tested individually in preliminary tests, with respect to their geometrical dimensions or the acoustically important material parameters. Thus, deviations in the characteristic data are determined before completing the transformer as a whole. The method described herein is not restricted to designs having rotational symmetry; rather, transformers having a square, rectangular or elliptical geometry can also be structured by means of the elastic molded parts described above.

We claim:

1. A method for producing an ultrasound transformer as a single integral unit that includes a piezoelectric transformer element coupled to an acoustical matching layer formed from an elastomer capable of vibrating said method comprising the steps of:

producing an elastomer body from a molded part having centering contours to form the matching layer;

positioning the transformer element into the elastomer body;

centering the transformer element by engaging said transformer element with the centering contours; and coupling the transformer element to the matching layer.

2. The method of claim i wherein the step of coupling the transformer element to the matching layer comprises the step of gluing the transformer layer to the matching layer.

3. The method of claim 2 wherein the transformer element has first and second metallized surfaces for making an electrical connection and further comprising the steps of: inserting a first lead wire between the first metallized surface and the matching layer when the first metallized surface is glued to the matching layer so that the first lead wire contacts the first metallized surface by adhesive pressure; and, soldering a second lead wire to the second metallized surface.

4. The method of claim 1 wherein a space is formed between the molded part and the transformer element: after the transformer element is inserted into the molded part.

5. The method of claim 2 wherein a space is formed between the molded part and the transformer element after the transformer element is inserted into the molded part.

6. The method of claim 3 wherein a space is formed between the molded part and the transformer element after the transformer element is inserted into the molded part.

7. The method of claim 4 further comprising the step of filling the space with a damping material.

8. The method of claim 5 further comprising the step of filling the space with a damping material.

9. The method of claim 6 further comprising the step of filling the space with a damping material.

10. The method of claim 1 wherein the elastomer forming the acoustical matching layer has a propagation velocity for longitudinal waves between approximately 800 and 1600 m/s and a density between approximately 500 and 1500 kg/m$^3$.

11. The method of claim 3 wherein the elastomer forming the acoustical matching layer has a propagation velocity for longitudinal waves between approximately 800 and 1600 m/s and a density between approximately 500 and 1500 kg/m$^3$.

12. The method of claim 4 wherein the elastomer forming the acoustical matching layer has a propagation velocity for longitudinal waves between approximately 800 and 1600 m/s and a density between approximately 500 and 1500 kg/m$^3$.

13. The method of claim 6 wherein the elastomer forming the acoustical matching layer has a propagation velocity for longitudinal waves between approximately 800 and 1600 m/s and a density between approximately 500 and 1500 kg/m$^3$.

14. The method of claim 7 wherein the elastomer forming the acoustical matching layer has a propagation velocity for longitudinal waves between approximately 800 and 1600 m/s and a density between approximately 500 and 1500 kg/m$^3$.

15. The method of claim 8 wherein the elastomer forming the acoustical matching layer has a propagation velocity for longitudinal waves between approximately 800 and 1600 m/s and a density between approximately 500 and 1500 kg/m$^3$.

16. The method of claim 9 wherein the elastomer forming the acoustical matching layer has a propagation velocity for longitudinal waves between approximately 800 and 1600 m/s and a density between approximately 500 and 1500 kg/m$^3$.

* * * * *